United States Patent [19]

Holcomb et al.

[11] Patent Number: 4,970,456

[45] Date of Patent: Nov. 13, 1990

[54] TEMPERATURE COMPENSATED POWER DETECTOR

[75] Inventors: Don R. Holcomb, Scottsdale; David Q. Ngo, Mesa, both of Ariz.

[73] Assignee: Motorola, Inc., Schaumburg, Ill.

[21] Appl. No.: 294,093

[22] Filed: Jan. 9, 1989

[51] Int. Cl.$^5$ .......................... G01R 21/10; G01R 1/44
[52] U.S. Cl. ...................................... 324/95; 324/105; 324/119; 324/132
[58] Field of Search .................. 324/95, 119, 105, 132, 324/123 R, 123 C; 330/256, 289; 364/483

[56] References Cited

U.S. PATENT DOCUMENTS

| | | | |
|---|---|---|---|
| 3,248,654 | 4/1966 | Shiragaki | 324/105 |
| 3,914,689 | 10/1975 | Wright | 324/95 |
| 4,628,277 | 12/1986 | Hill et al. | 324/105 |
| 4,764,720 | 8/1988 | Nystrom | 324/105 |

Primary Examiner—Ernest F. Karlsen
Attorney, Agent, or Firm—Maurice J. Jones

[57] ABSTRACT

A temperature compensated power detector utilizes a temperature compensating diode connected to an inverting input of an amplifier to enable the amplifier to substantially cancel out undesirable temperature effects caused by a power level detector diode coupled to the non-inverting input of the amplifier. As a result, the amplifier output voltage tends to remain constant over temperature in response to a fixed power level being applied to the detector. A lookup table is utilized to determine the power level corresponding to a power detector output voltage of a particular magnitude.

9 Claims, 2 Drawing Sheets

TEMPERATURE COMPENSATED POWER DETECTOR

BACKGROUND OF THE INVENTION

This invention relates, in general, to circuitry for detecting electrical power and, more particularly, to such circuitry having temperature compensation.

There are many applications wherein it is desired to provide detection and/or measurement of electrical power over a wide band. e.g. .4 Megahertz ($MH_z$) to 1000 $MH_z$. An example of such a requirement is provided by electronic equipment for testing radio frequency (RF) transmitters which operate at different frequencies. More specifically, it is desirable to measure the output power of such transmitters during production, operation and repair tests. Moreover, it is desirable for power detector circuits utilized in these applications to operate over a wide range of temperatures, e.g. from 0 to 70° C.

Prior art circuits have been developed for power detection and measurement. Some of these circuits include a plurality of components such as diodes and operational amplifiers. Other prior art circuitry utilize thermistors. Prior art circuits employing a large number of components tend to have reliability problems. Moreover, some prior art circuit configurations for operating over a wide frequency band require time consuming test and alignment procedures which increase costs. Furthermore, some prior art circuits do not provide accurate results over a wide temperature range.

SUMMARY OF THE INVENTION

Accordingly, it is an object of the present invention to provide temperature compensated, power detection circuitry wherein the number of components are minimized and which requires minimum adjustments.

A temperature compensated electrical power detector circuit in accordance with a particular embodiment of the present invention includes rectifier, amplifier and temperature compensation circuitry. The rectifier circuit has a predetermined temperature characteristic and provides a control signal having a magnitude which undesirably changes with temperature change. The control signal is provided in response to an input signal having a power level to be detected. The amplifier has inverting and non-inverting inputs. One of the amplifier inputs is connected to receive the control signal. The temperature compensation circuit provides a temperature compensating signal to the other input of the amplifier. The compensating signal has a temperature characteristic which is similar to the predetermined temperature characteristic of the rectifier circuit. The amplifier is responsive to the compensation signal and to the control signal to provide an electrical power indication signal having a magnitude which remains substantially constant over a predetermined temperature range, in response to the power level of the input signal also remaining constant.

An electronic "lookup" table can be provided to compensate for the nonlinear relationship between the actual power level and the magnitude of the electrical power indication signal.

BRIEF DESCRIPTION OF THE DRAWINGS

A more complete understanding of the present invention may be derived by referring to the detailed description and the claims when considered along with the accompanying drawings in which:

DETAILED DESCRIPTION OF THE PREFERRED EMBODIMENT

Figure 1:
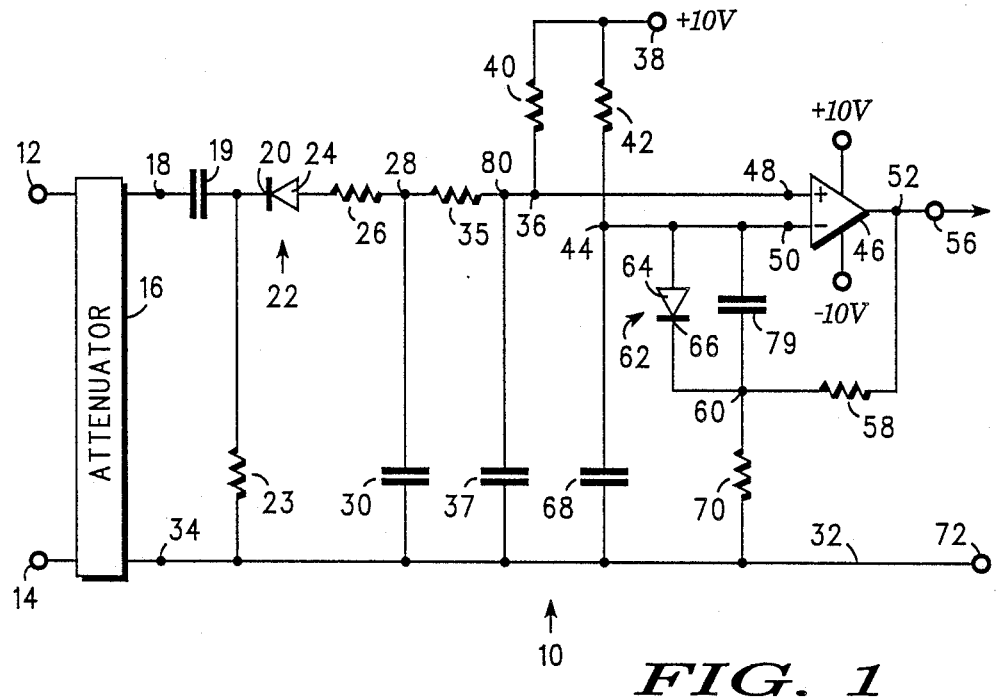
FIG. 1 illustrates a schematic diagram of a temperature compensated power detector circuit.

FIG. 1 is a schematic diagram of an electrical power detector circuit 10. Input terminals 12 and 14 of attenuator 16 are connected to the output terminals of RF power supplying circuitry such as a transmitter which provides the power for detection and/or measurement. Attenuator 16 which may have a known configuration provides a load of a predetermined magnitude, e.g. 50 ohms, across terminals 12 and 14. Attenuator 16 also can be adapted to provide a known amount of attenuation such as 24 decibels (db). Output terminal 18 of attenuator 16 is coupled through direct current (DC) blocking capacitor 19 to cathode electrode 20 of detection diode 22. One terminal of resistor 23 is connected to cathode 24. Resistor 23 provides a DC return path for diode 22. A "hot carrier" diode can be used as diode 22 to provide a low capacitance of approximately .5 picofarads. Accordingly, "hot carrier" type diodes present larger amounts of series or load impedance to RF than other kinds of diodes having greater junction capacitances. Hence, hot carrier diodes tend to not undesirably load the driving circuitry connected to input terminals 12 and 14. Anode 24 of diode 22 is coupled through resistor 26 to node 28. Filter capacitor 30 is connected between node 28 and a negative or ground power supply conductor 32. Output terminal 34 of attenuator 16 is also connected to a conductor 32.

Resistor 35 is connected between node 28 and node 36. Capacitor 37 is connected between node 36 and conductor 32. Positive power supply conductor 38 is coupled through resistor 40 to node 36 and through resistor 42 to node 44. Operational amplifier 46, which can be a Motorola integrated circuit (MC 34072D) having a known configuration, has a non-inverting input terminal 48 connected to node 36 and an inverting input terminal 50 connected to node 44. Output terminal 52 of amplifier 46 is connected to output terminal 56 of power detector 10 and through feedback resistor 58 to node 60. Temperature compensating hot carrier diode 62 includes an anode electrode 64 connected to node 44 and a cathode electrode 66 connected to node 60. Audio frequency filter capacitor 68 is connected between node 44 and conductor 32 and radiated RF filter capacitor 79 is connected between nodes 44 and 60. Resistor 70 couples node 60 to negative power supply conductor 32 which is also connected to output terminal 72 of power detector circuit 10.

If a constant amount of RF electrical power is applied between terminals 12 and 14, it is desired that the output voltage across output terminals 56 and 72 also remain at a fixed level representative of the constant power level even though the temperature of the components of circuit 10 change over a predetermined range such as from 0° to 70° C. The temperatures of these components can change because of heat dissipated by attenuator 16 and because of ambient temperature change, for example. As the temperature of detector diode 22 changes, the junction voltage thereof changes at a rate of approximately 1 millivolt per degree C. This undesirable change in voltage tends to provide a corresponding undesirable change in the magnitude of the control voltage applied to the non-inverting input terminal 48 of amplifier 46. This tends to undesirably cause the magnitude of the power indication output voltage between output terminals 56 and 72 to change.

Temperature compensating diode 62 is arranged to provide a corresponding change to the magnitude of the compensating voltage provided to inverting input terminal 50 of amplifier 46. As a result, amplifier 46 enables these temperature dependent voltage magnitude changes to substantially cancel each other out to provide a power indication voltage of substantially constant magnitude between output terminals 56 and 72 even though the temperature of diode 22 changes. To accomplish this result, it is desirable for diodes 22 and 62 to have closely matched electrical characteristics and to be biased at the same operating points on these characteristics. Thus, it is desirable for the resistance from positive power supply conductor 38 through the DC circuit leg or path in series with diode 22 and including resistors 40, 35, 26 and 23 to be approximately equal to the resistance in series with diode 62 provided by the series path from conductor 38 through resistor 42 and the equivalent resistance of resistors 58 and 70. More specifically, the resistances of resistors 40 and 42 can have a relatively high but equal values so that nodes 36 and 44 approximate the output terminals of current sources which current bias respective diodes 22 and 62 to have low capacitance and hence, high impedances which do not overload the input circuitry providing the power to be measured. Resistors 35, 26 and 23 can have approximately the same resistance as the equivalent resistance provided by resistors 58 and 70 at node 60. The resistances in each of these paths are thereby arranged so that diodes 22 and 62 are biased at approximately the same points on their operating characteristics. Each diode can be biased slightly conductive, for instance.

During dynamic operation, a sinusoidal or alternating input RF signal having a power level to be detected or measured is applied across input terminals 12 and 14 of attenuator 16 and developed between terminals 18 and 34. Capacitor 19 blocks the DC level of the alternating current (AC) input signal so that it does not interfere with the AC power indication. Diode 22 is rendered conductive by the negative going portions of the input signal. Resistors 26 and 35 and capacitors 30 and 37 cooperate to filter out most of the AC components of the rectified signal provided by diode 22. The DC voltage at node 80 tends to have a magnitude equal to the peak value of the RF voltage at terminal 18 minus the junction voltage ($\phi$) of diode 22. Resistor 26 also tends to nullify the effects of the series resistance of diode 22. Thus, the DC control voltage is provided at input terminal 48 of amplifier 46. Amplifier gain determining feedback resistors 58 and 70 tend to have resistance of high values. The parallel combination of a resistors 58 and 70 forms an equivalent resistance to ground. For example, if 58 and 70 are each 1 kilohm, the equivalent resistance is 500 ohms which can be approximately the value of resistor 35. So the total resistance to ground from node 44 is the resistance of diode 62 plus the 500 ohm equivalent resistance of of resistors 58 and 70. This total resistance is approximately (nominally) equal to that from node 36 to ground. Resistors 58 and 70 determine the gain of amplifier 46 in a known manner to be desired value which may be, for instance, between 1 and 2.

Thus, if the control voltage magnitude on input terminal 48 is assumed to be V peak $-\phi$ and the magnitude of the input signal on inverting input terminal 50 is assumed to be $-\phi$ and the gain of amplifier 46 is 2, then a voltage having a magnitude of approximately twice V peak will occur between output terminals 56 and 72. The $\phi$ component provided by diode 62 at terminal 50 will cancel the undesirably temperature sensitive $\phi$ component provided at input terminal 48 by diode 22. Since these $\phi$ components are the main contributors to change in output voltage with temperature in circuit 10, their cancellation results in an output voltage magnitude between terminals 56 and 72 which remains substantially constant even though the ambient temperature changes between 0 and 70° C., for constant power input signals.

Figure 2:
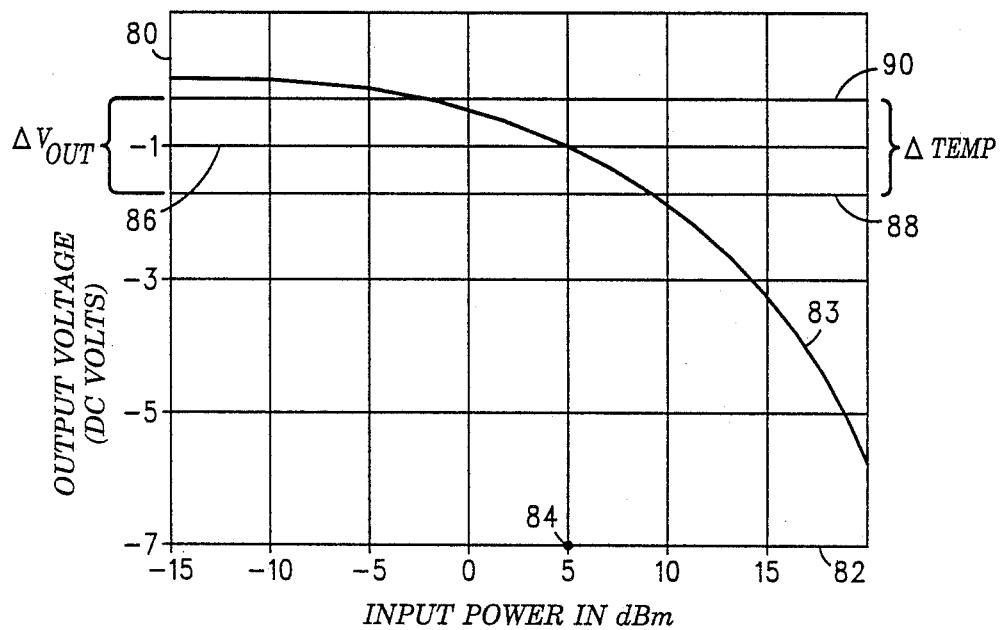
FIG. 2 is a graph showing the magnitude of the output voltage of the circuitry of FIG. 1 as a function of input power.

More specifically, FIG. 2 shows an ordinate axis 80 for measuring the output voltage magnitude of amplifier 46 between terminals 52 and 72 and an abscissa axis 82 for measuring input power magnitude in decibels above or below 1 milliwatt (dBm) across input terminals 12 and 14 to provide curve 83. A given value of input power is designated by point 84 which under constant temperature would provide an output voltage between output terminals 52 and 72 of a constant magnitude shown by level 86. If the compensating effect of diode 62 is excluded from circuit 10 then a change in temperature could cause the output voltage of amplifier 46 to undesirably vary between levels 88 and 90 even though the AC input power magnitude represented by point 84 remained constant. A volt meter connected across output terminals 56 and 72 would erroneously indicate that the power of the input signal changed when only the temperature of diode 22 had changed.

Figure 3:
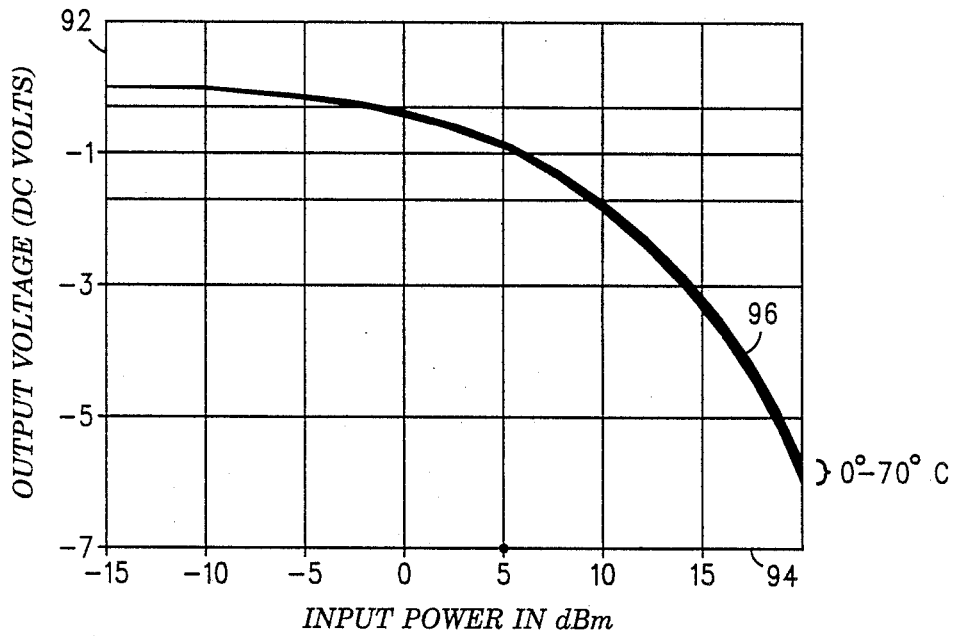
FIG. 3 illustrates a range of characteristics showing the magnitude of the output voltage of the circuitry of FIG. 1 as a function of temperature change for different input power levels.

FIG. 3 indicates a graph having an ordinate axis 92 for measuring the output voltage magnitude between output terminals 52 and 72 of circuit 10 and an abscissa axis 94 indicating the AC input power magnitude in dBm. Curve 96 indicates the characteristics over the temperature range between 0°-70° C. for a circuit 10 including temperature compensating diode 62 and having components with the values shown in the following table:

| Capacitors 19, 30, 37, 68 | .1 microfarad |
|---|---|
| Resistor 23 | 51.1 ohms |
| Resistor 26 | 22.1 ohms |
| Resistor 35 | 475 ohms |
| Resistors 40, 42 | 47.5 kilohm |
| Resistors 58, 70 | 1000 ohms |
| Capacitor 79 | 100 picofarads |

As previously mentioned, much of the change in temperature of diode 22 can be caused by attenuator 16 dissipating the electrical power of the input signal applied thereto. Thus, it is desirable for diodes 22 and 62 to be located in approximately the same heat flow paths with respect to attenuator 16 so that they remain at the same temperature to enable diode 62 to closely compensate diode 22. Diodes 62 and 22 can each be a Motorola MMBD 501, for example.

As illustrated by the curvature of characteristic 83 of FIG. 2, the output voltage between terminals 56 and 72 tends to vary in a nonlinear manner with input power 82. More specifically, this output voltage tends to be square law at lower power levels and linear at higher power levels. Accordingly, it is necessary in some applications to provide a "lookup table" so that the correct power level can be read off of the table in correspondence to a particular output voltage magnitude. The lookup table can be arranged to provide either average power or peak power. The table can be provided in the form of a chart or the "lookup table" can be provided electronically.

Figure 4:
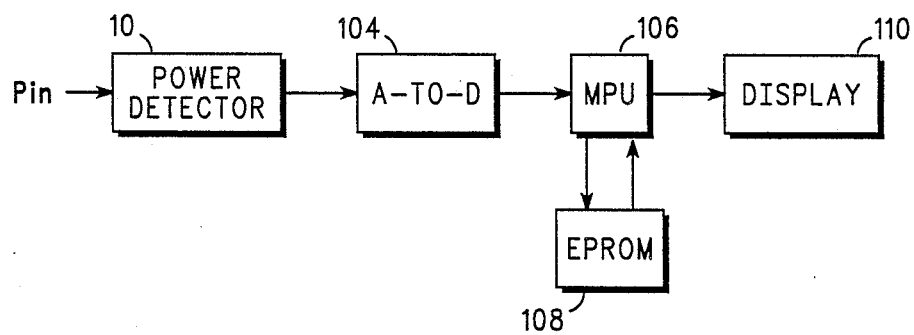
FIG. 4 is a block diagram illustrating an electronic lookup table which is employed to determine the power levels corresponding to the magnitudes of the output voltage of the circuitry of FIG. 1.

Referring to FIG. 4, analog-to-digital (A-to-D) circuit 104 receives the analog output voltage from circuit 10 and converts it to a digital signal which is applied to microprocessor (MPU) 106. Circuit 10 as shown in FIG. 1 provides an output voltage having a negative going magnitude at terminal 56 which is connected to A-to-D converter 104. The polarity of diodes 22 and 62 and the power supply polarities on terminals 38 and 32 can be reversed if a positive going output voltage is desired. MPU 106 provides the digital signal to Erasable Programmable Read Only Memory (EPROM) 108 which has an empirically derived lookup table programmed therein in a known manner and provides the appropriate corresponding power level value to MPU 106, which then provides the appropriate digital signal to control display 110.

If desired, an intentional imbalance can be created in the aforedescribed series bias paths for diodes 62 and 22 by providing a small amount more resistance in one path than the other to enable circuit 10 to provide an output signal which is within the range of A-to-D converter 104 under normal conditions. Moreover, the values of the resistors 58 and 70 can be selected to adjust the gain of amplifier 46 such that the range of the signal magnitudes between output terminals 56 and 72 of power detector 10 cover the range of A-to-D converter circuit 104 but do not over drive it.

Thus, temperature compensated power detection circuitry 10 has been described which has a minumum number of components and which requires a minimum amount of adjustment or alignment over temperature. The circuit operates over a wide frequency range of .4 $MH_z$ to 1000 $MH_z$.

While the invention has been particularly shown and described with reference to a preferred embodiment, those skilled in the art will understand that changes in form and details may occur therein without departing from the scope of the present invention.

We claim:

1. A temperature compensated electrical power detector circuit for providing a power indication output signal having a magnitude that varies with the magnitude of the electrical power of an input signal, the power detector circuit including in combination:
   rectifier means having a predetermined temperature characteristic, said rectifier means being adapted to receive the input signal and to provide a control signal having a magnitude which undesirably changes with temperature change;
   amplifier means having a first input terminal, a second input terminal and an output terminal, said amplifier means allowing the polarity of signals applied to said first input terminal to remain unchanged, and said amplifier means inverting the polarity of signals applied to said second input terminal;
   first circuit means coupling said control signal from said rectifier means to one of said first and second input terminals of said amplifier means;
   temperature compensation means providing a compensation signal having a temperature characteristic which is similar to said predetermined temperature characteristic of said rectifier means;
   second circuit means coupling said compensation signal to the other of said first and second input terminals of said amplifier means; and
   said amplifier means being responsive to said control signal and said compensation signal to provide the power indication output signal having a magnitude which remains substantially constant over a predetermined temperature range in response to the input signal having a power level of constant magnitude.

2. The temperature compensated electrical power detector circuit of claim 1 further including:
   first power supply conductor means for providing a power supply potential of a first polarity;
   second power supply conductor means for providing a power supply potential of a second polarity;
   said rectifier means including first electron control means having said predetermined temperature characteristic;
   first circuit path means including said first electron control means and first resistance means extending between said first power supply conductor means and said second power supply conductor means, said first resistance means having a predetermined magnitude; and
   second circuit path means extending between said first power supply conductor means and said second power supply conductor means, said second circuit path including second electron control means having a temperature characteristic which is substantially identical to the temperature characteristic of said first electron control means and second resistance means having a resistance with a magnitude substantially identical to the resistance of said first resistance means to enable said second electron control means to have substantially the same temperature characteristic as said first electron control means.

3. The temperature compensated electrical power detector circuit of claim 1 wherein said amplifier means is an operational amplifier having non-inverting and inverting input terminals respectively corresponding to said first and second input terminals;
   said first circuit means coupling said control signal to said first input terminal; and
   resistive means extending between said amplifier output terminal and said inverting input terminal.

4. The temperature compensated electrical power detector circuit of claim 1 wherein said rectifier means includes:
   first diode means;
   direct current return path means for said first diode means; and capacitive means.

5. The temperature compensated electrical power detector circuit of claim 1 wherein said first circuit means includes resistive means.

6. The temperature compensated electrical power detector circuit means of claim 1 wherein the magnitude of the power indication output signal tends to have a nonlinear relation to electrical power magnitude, further including:
- analog-to-digital converter means coupled to said amplifier means;
- microprocessor means coupled to said analog-to-digital converter means;
- electrical memory means coupled to said microprocessor means;
- display means coupled to said microprocessor means; and
- said electrical memory means providing a lookup table for interpreting the electrical power level corresponding to particular magnitudes of the power indication output signal so that said display means can provide an accurate display of the magnitude of the electrical power of the input signal.

7. A temperature compensated electrical power detector circuit for providing an output signal having a magnitude which varies with the magnitude of the power of an alternating input signal, the power detector circuit including in combination:
- rectifier means including a first diode means having a predetermined temperature characteristic, said rectifier means being adapted to receive the alternating input signal and to provide a control signal having a magnitude which undesirably changes with temperature change;
- amplifier means having a first input terminal and a second input terminal, said amplifier means allowing the polarity of signals applied to said first input terminal to remain unchanged and said amplifier means inverting the polarity of signals applied to said second input terminal;
- first circuit means coupling said control signal to said first input terminal of said amplifier means;
- temperature compensation means including a second diode means for providing a compensating signal having a temperature characteristic which is similar to said predetermined temperature characteristic of said first diode means;
- second circuit means coupling said compensation signal to said second input terminal of said amplifier means; and
- said amplifier means being responsive to said control signal and said compensation signal to provide an output signal having a magnitude which remains substantially constant over a predetermined temperature range in response to the alternating input signal having a power of constant magnitude.

8. The temperature compensated electrical power detector circuit of claim 7 further including:
- first power supply conductor means providing a power supply potential of a first polarity;
- second power supply conductor means providing a power supply potential of a second polarity;
- first circuit path means including said first diode means and first resistance means, said first circuit path means extending between said first power supply conductor means and said second power supply conductor means, said first resistance means having a predetermined magnitude; and
- second circuit path means extending between said first power supply conductor means and said second power supply conductor means, said second circuit path including second diode means and second resistance means, said second resistance means having a resistance with a magnitude substantially identical to the resistance of said first resistance means to enable said second diode means to have substantially the same temperature characteristic as said first diode means.

9. The temperature compensated electrical power detector circuit means of claim 1 wherein the magnitude of said output signal tends to have a nonlinear relation to electrical power level, further including:
- analog-to-digital converter means coupled to said amplifier means;
- microprocessor means coupled to analog-to-digital converter means;
- electrical memory means coupled to said microprocessor means;
- display means coupled to said microprocessor means; and
- said electrical memory means providing a lookup table for interpreting the electrical power level corresponding to particular magnitudes of said output signal so that said display means can provide an accurate display of the magnitude of the electrical power of the alternating input signal.

* * * * *